(12) United States Patent
Pacheco et al.

(10) Patent No.: US 11,506,709 B2
(45) Date of Patent: Nov. 22, 2022

(54) X-RAY FILTER

(71) Applicant: Intel Corporation, Santa Clara, CA (US)

(72) Inventors: Mario Pacheco, Tempe, AZ (US); Deepak Goyal, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 853 days.

(21) Appl. No.: 16/199,092

(22) Filed: Nov. 23, 2018

(65) Prior Publication Data
US 2020/0166569 A1    May 28, 2020

(51) Int. Cl.
*G01N 23/04* (2018.01)
*G01R 31/303* (2006.01)

(52) U.S. Cl.
CPC .......... *G01R 31/303* (2013.01); *G01N 23/04* (2013.01); *G01N 2223/313* (2013.01); *G01N 2223/611* (2013.01); *G01N 2223/645* (2013.01)

(58) Field of Classification Search
None
See application file for complete search history.

(56) References Cited

U.S. PATENT DOCUMENTS

| | | | |
|---|---|---|---|
| 2006/0104421 A1* | 5/2006 | Distler | A61B 6/06 378/156 |
| 2018/0168524 A1* | 6/2018 | Melman | A61B 6/4411 |
| 2020/0100750 A1* | 4/2020 | Mertelmeier | A61B 6/032 |

* cited by examiner

*Primary Examiner* — Hoon K Song
(74) *Attorney, Agent, or Firm* — Akona IP PC

(57) ABSTRACT

Embodiments may relate an x-ray filter. The x-ray filter may be configured to be positioned between an x-ray source output and a device under test (DUT) that is to be x-rayed. The x-ray filter may include at least 80% titanium (Ti) by weight. Other embodiments may be described or claimed.

20 Claims, 6 Drawing Sheets

X-RAY FILTER

BACKGROUND

The package assembly and board-mounting of microelectronic devices may require the inspection or screening of solder joints and metal traces interconnect for quality or reliability testing purposes. However, when such microelectronic devices contain memory die, the radiation used in commercial x-ray equipment may alter the electrical conditions of memory die at gate level, which may potentially induce irreversible damage.

DETAILED DESCRIPTION

Figure 1:
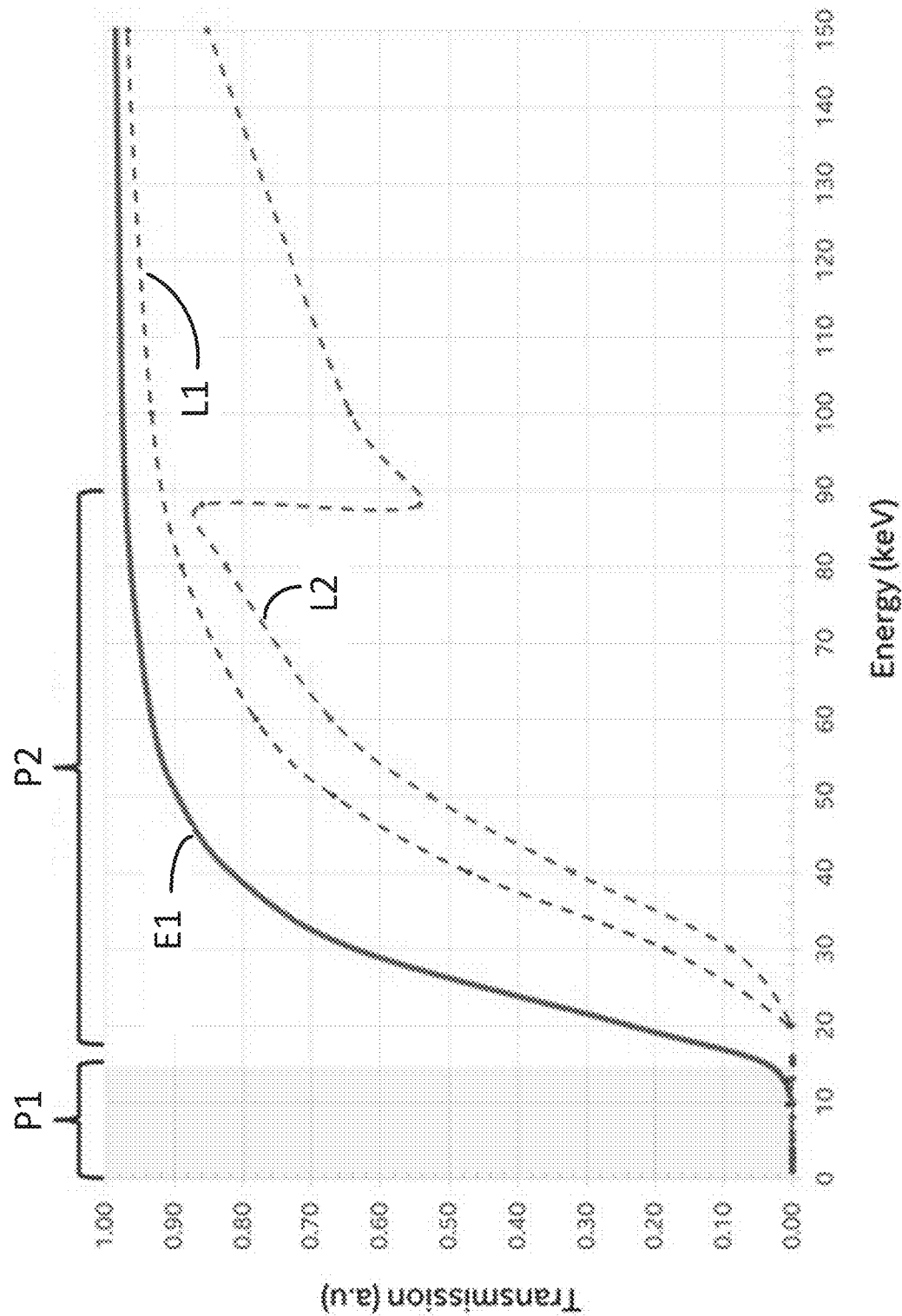
FIG. 1 depicts an example graph showing transmission characteristics of an x-ray filter, in accordance with embodiments herein.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

As noted above, legacy commercial x-ray equipment may negatively impact memory that is being scanned. As used herein, the memory or memory die may be referred to as a device under test (DUT). Embodiments herein may provide protection from the x-rays for chips such as active silicon die, and more particularly to DUT, during x-ray inspection of interconnects' quality in the package assembly process, board-mounting manufacturing processes, failure analysis process, or other periods where x-ray imaging may be performed.

As discussed herein, examples of DUTs, and particularly of memory die, may include Dynamic Random Access Memory (DRAM), Static Random Access Memory (SRAM). High-bandwidth memory (HBM), etc. As used herein, x-rays may refer to electromagnetic radiation having a wavelength ranging from approximately 0.01 to approximately 10 nanometers (nm).

Embodiments herein may selectively block the radiation dosage in an energy spectrum range that may provide a high risk of inducing permanent damage to semiconductor devices at the gate level. Embodiments may further bypass energies of the x-ray source spectrum that may provide proper brightness or contrast for effective x-ray inspection and imaging.

More specifically, embodiments may include an x-ray filter that selectively blocks the x-ray radiation energies that may be absorbed by a DUT at gate level, and thus may have the potential to induce permanent damage to the DUT. More generally, the amount of damage may be based on the exposure time needed for x-ray inspection of the DUT. As used herein, "gate level" may refer to measurements made with respect to memory gates. Embodiments may further bypass the x-ray radiation energies needed for optimum imaging of package or board interconnects, thus not affecting, or only minimally affecting, defect detection resolution.

Embodiments may provide a number of advantages. For example, embodiments may prevent or reduce costly single or multi-stacked memories from being permanently damaged or destroyed an assembly during first level or second level interconnect quality inspection. Embodiments may also prevent or reduce memory damage or destruction during failure analysis while inspecting customer returned parts, during material review board (MRB), or during other times where x-ray analysis may be performed. Embodiments may also allow manufacturers of x-ray filters discussed herein to provide the filters to customers to perform x-ray inspection without damaging memory components.

Generally, memory gates may be comprised of silicon or copper, with a typical volume size of less than 200 nm on each side. The x-ray absorption of a memory gate may be energy dependent, and may be calculated using the attenuation coefficient's plots of copper and silicon. Generally, memory gates may be highly absorbing at energies below 15 kilo electron volts (keV), and relatively x-ray transparent at energies above 15 keV. Thus, embodiments may relate to an x-ray filter that is designed to block x-ray energies less than approximately 15 keV, and increasingly bypass x-ray energies above approximately 15 keV.

Absorbed x-ray energies may have a cumulative effect in the case of a DUT such as a memory die. This cumulative effect may occur even though a relatively small portion of the incident x-ray beam line may be absorbed by the energy die (i.e., the portion of the x-ray beam line with energies below 15 keV) after a relatively short time period (e.g., on the order of a few seconds). The cumulative x-ray absorption may cause leakage effects in the memory gate, and potentially affect the device refresh rate.

This cumulative effective absorbed x-ray energy may be overcome by using a filter, however legacy filters such as those made primarily of zinc or lead may produce transmission spikes at energies below approximately 15 keV. These spikes may be more pronounced when the filter is designed to bypass as a greatest amount possible of x-ray photons that may be used for x-ray imaging.

Thus, to use legacy filters, thicker filters may be required to reduce or block transmission spikes at energies below approximately 15 keV. However, the use of thicker filters itself may introduce negative side effects such as significant blockage or deterioration in the transmission of x-ray energies needed for x-ray inspection at energies above approximately 15 keV.

Instead of using primarily zinc or lead, embodiments herein may relate to using titanium in an x-ray filter that is to be used to x-ray memory such as DRAM, SRAM, HBM, etc. Specifically, the x-ray filter may include approximately 80% titanium by weight. In specific embodiments, the x-ray filter may include even more titanium by weight, for example 90% titanium by weight. In some embodiments the titanium may be pure titanium, while in other embodiments the titanium may be a titanium alloy. In some embodiments where the x-ray filter includes less than 100% titanium or a titanium alloy, the x-ray filter may include one or more additional dopants or materials such as Carbon, Aluminum, Iron, Copper. Generally, these variations of usage of titanium in an x-ray filter may be collectively referred to herein as a "titanium filter." In embodiments herein, the titanium filter may block a significant amount of x-ray energy at energies below approximately 15 keV, while bypassing a significant amount of x-ray energy at energies above approximately 15 keV.

FIG. 1 depicts an example graph showing transmission characteristics of an x-ray filter, in accordance with embodiments herein. Specifically, the X-axis of FIG. 1 depicts x-ray energy in keV. The Y-axis of FIG. 1 depicts the energy transmission in units of arbitrary units (a.u.). Generally, a.u. may relate to percentages. For example. 0.1 a.u. may correspond to 10%. 0.01 a.u. may correspond to 1%, etc. The X-axis is divided in FIG. 1 into two general portions, P1 and P2. Portion P1 generally depicts x-ray energies of less than approximately 15 keV, and portion P2 generally depicts x-ray energies of greater than approximately 15 keV.

Dashed lines L1 and L2 may depict the transmission characteristics of legacy filters. Specifically, L1 may depict example transmission characteristics of a zinc filter, and L2 may depict example transmission characteristics of the lead filter. Specifically, L1 may relate to a zinc filter that is approximately 200 micrometers ("microns" or "μm") thick as measured in a direction parallel to the x-ray beam line. L2 may relate to a lead filter that is approximately 70 microns thick as measured in a direction parallel to the x-ray beam line.

By contrast, line E1 may depict example transmission characteristics of a titanium filter in accordance with embodiments herein. In embodiments, the titanium filter may be between approximately 100 microns and approximately 300 microns thick as measured in a direction parallel to the x-ray beam line. More specifically, the titanium filter related to data used for FIGS. 1 and 2 may have a thickness of approximately 200 microns as measured in a direction parallel to the x-ray beam line. However, in other embodiments the titanium filter may be thicker or narrower. For example, in some embodiments the filter may be greater than approximately 1 millimeter ("mm") thick. As can be seen, the titanium filter at line E1 may block a significant amount of x-ray energy in portion P1. However, the titanium filter at line E1 may bypass significantly more energy in portion P2 than the legacy filters at lines L1 and L2.

For example, as can be seen in FIG. 1, the x-ray filter at E1 may have a transmission rate of less than 0.06 a.u. for energies between approximately 0 keV and approximately 15 keV (i.e., in portion P1). The x-ray filter at E1 may further have a transmission rate of greater than approximately 0.2 a.u. for energies greater than approximately 20 keV. The x-ray filter at E1 may further have a transmission rate of greater than approximately 0.8 a.u. for energies greater than approximately 40 keV. These data points are intended as examples of line E1 in FIG. 1, and various other transmission rate characteristics may be seen in FIG. 1.

Figure 2:
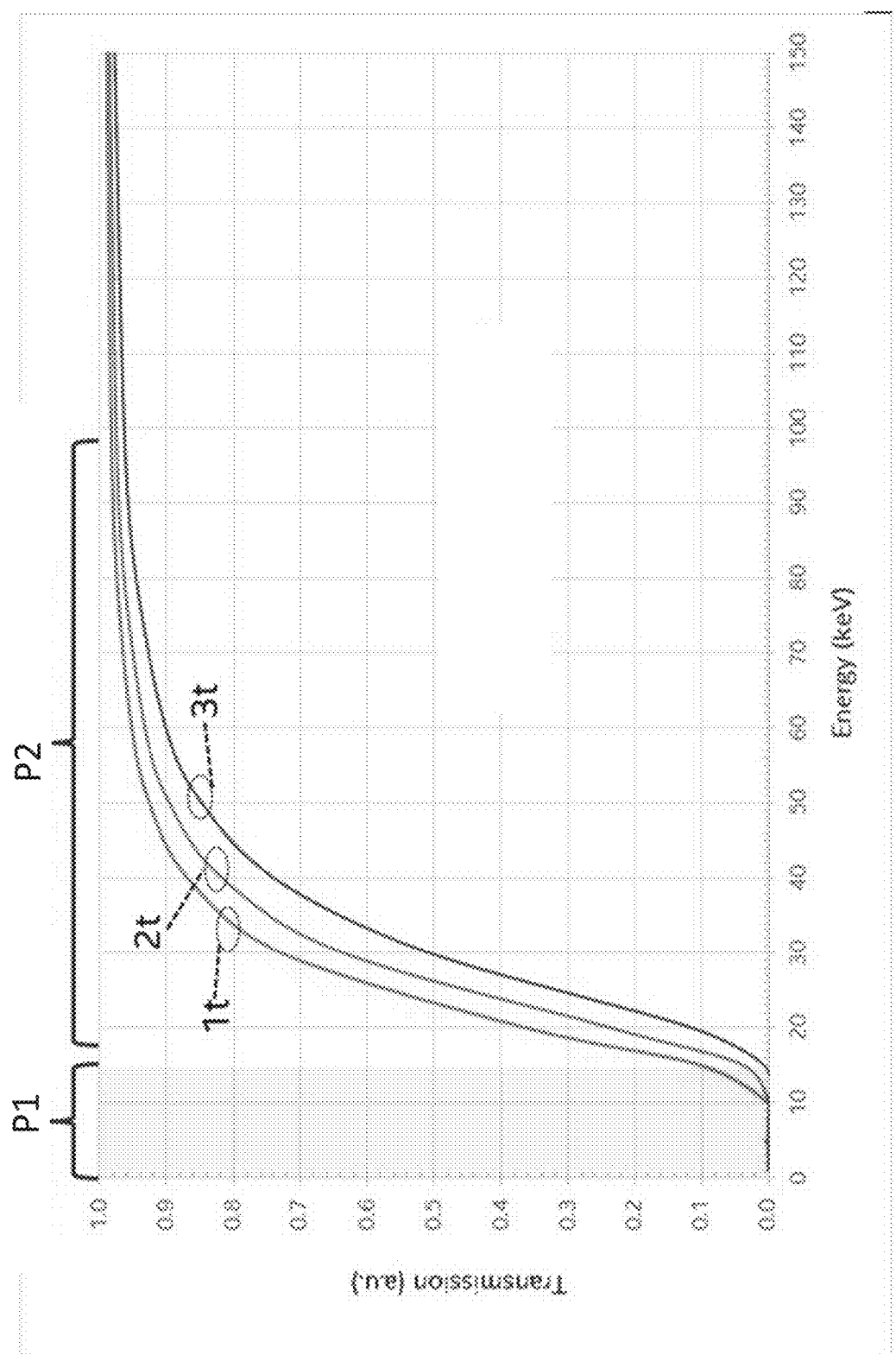
FIG. 2 depicts another example graph showing transmission characteristics of an x-ray filter, in accordance with embodiments herein.

Generally, embodiments may additionally use a set of filters with different thicknesses, dependent on inspection goals and the time the DUT is to be kept inside the x-ray chamber. FIG. 2 depicts another example graph showing transmission characteristics of an x-ray filter, in accordance with embodiments herein. Specifically, FIG. 2 depicts an example of transmission spectra of a titanium filter for different total x-ray exposure time requirements, such that allowing x-ray dosage of energies below approximately 15 keV may be kept fairly constant. However, increasing dosage of energies about approximately 15 keV may be possible in situations where such dosages are desirable. Such situations may include thicker or more copper-dense packages or boards, or to perform multiple collection of two-dimensional (2D) images as may be required by three-dimensional (3D) x-ray techniques. As a result of using a titanium filter, a memory or some other semiconductor chip may be subjected to x-rays for 60 minutes or more without destroying the memory, and without significantly affecting x-ray defect detection resolution.

Specifically, similarly to FIG. 1, the X-axis of FIG. 2 may depict x-ray energies in units of keV, and the Y-axis may transmission rates in units of a.u. Specifically, FIG. 2 may include two portions P1 and P2 along the X-axis, which may be similar to portions P1 and P2 of FIG. 1. FIG. 2 also includes three lines that depict example transmission characteristics of a titanium filter, $1t$, $2t$, and $3t$. The lines may show the progression of the transmission characteristics of the titanium filter under different time periods of exposure. Specifically, the line $1t$ depicts the transmission characteristics of a titanium filter after exposure for a first unit in time, t. As used for discussions herein, time t may depend on specific material composition and shape of device under test (DUT), as well as inspection goals. For example, if referencing line $1t$, the device under test may be kept in the x-ray beamline for 10 minutes without destroying the DUT; line $2t$ may relate to keeping the device under test in the x-ray beamline for 20 minutes, and so on.

Line $2t$ depicts the transmission characteristics of a titanium filter after exposure for two units in time, $2t$. Line $3t$ depicts the transmission characteristics of a titanium filter after exposure for three units in time, $3t$. As can be seen, even at $3t$ the transmission rate of the titanium filter within portion P1 is relatively low, and then increasing relatively swiftly within portion P2. As such, the titanium filter may allow significant amounts of x-rays at energies within portion P2 to reach the DUT under test while minimizing or negating the amounts of x-rays at energies within portion P1.

Figure 3:
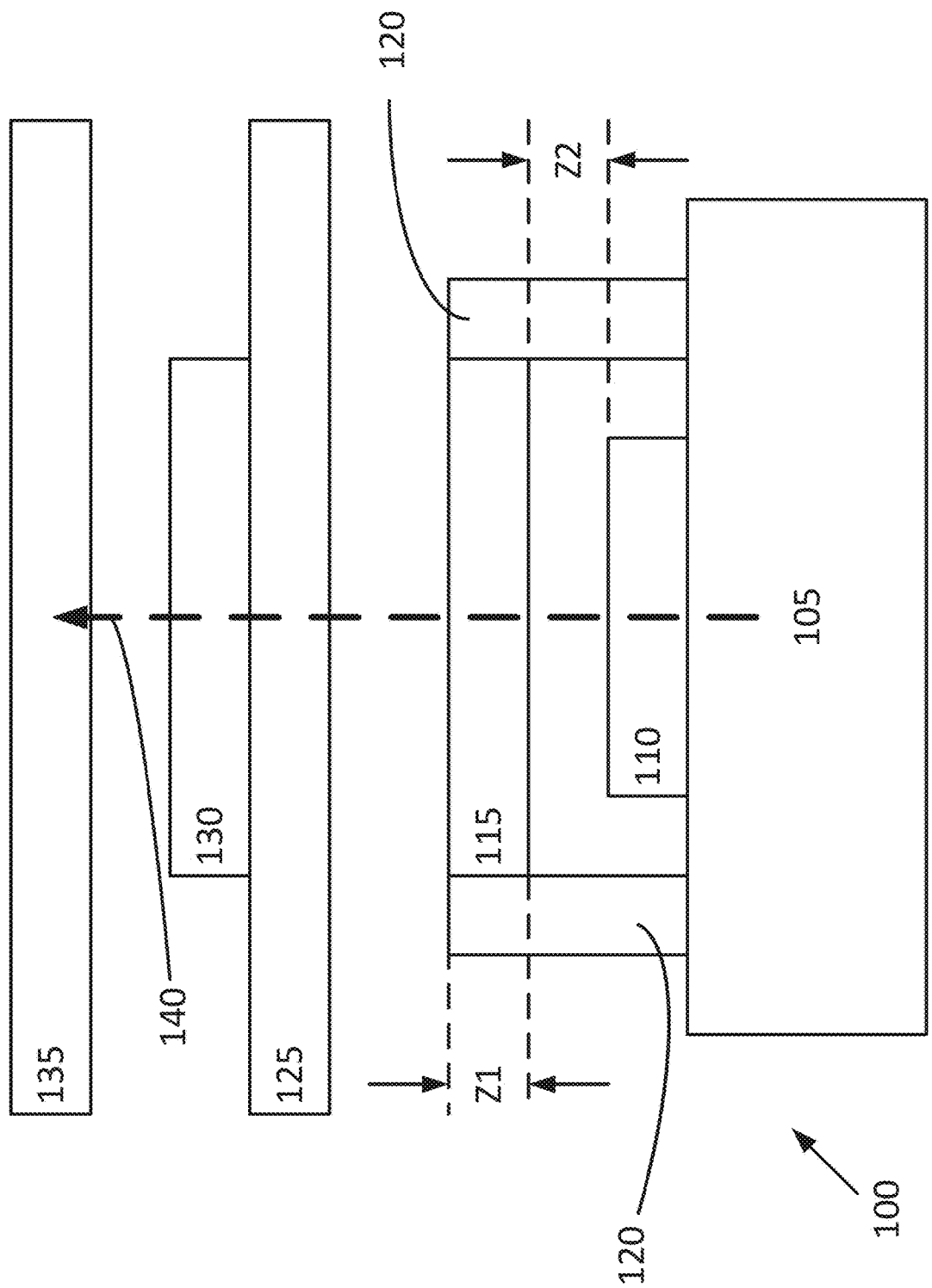
FIG. 3 depicts an example x-ray machine in use with an x-ray filter, in accordance with embodiments herein.
Figure 4:
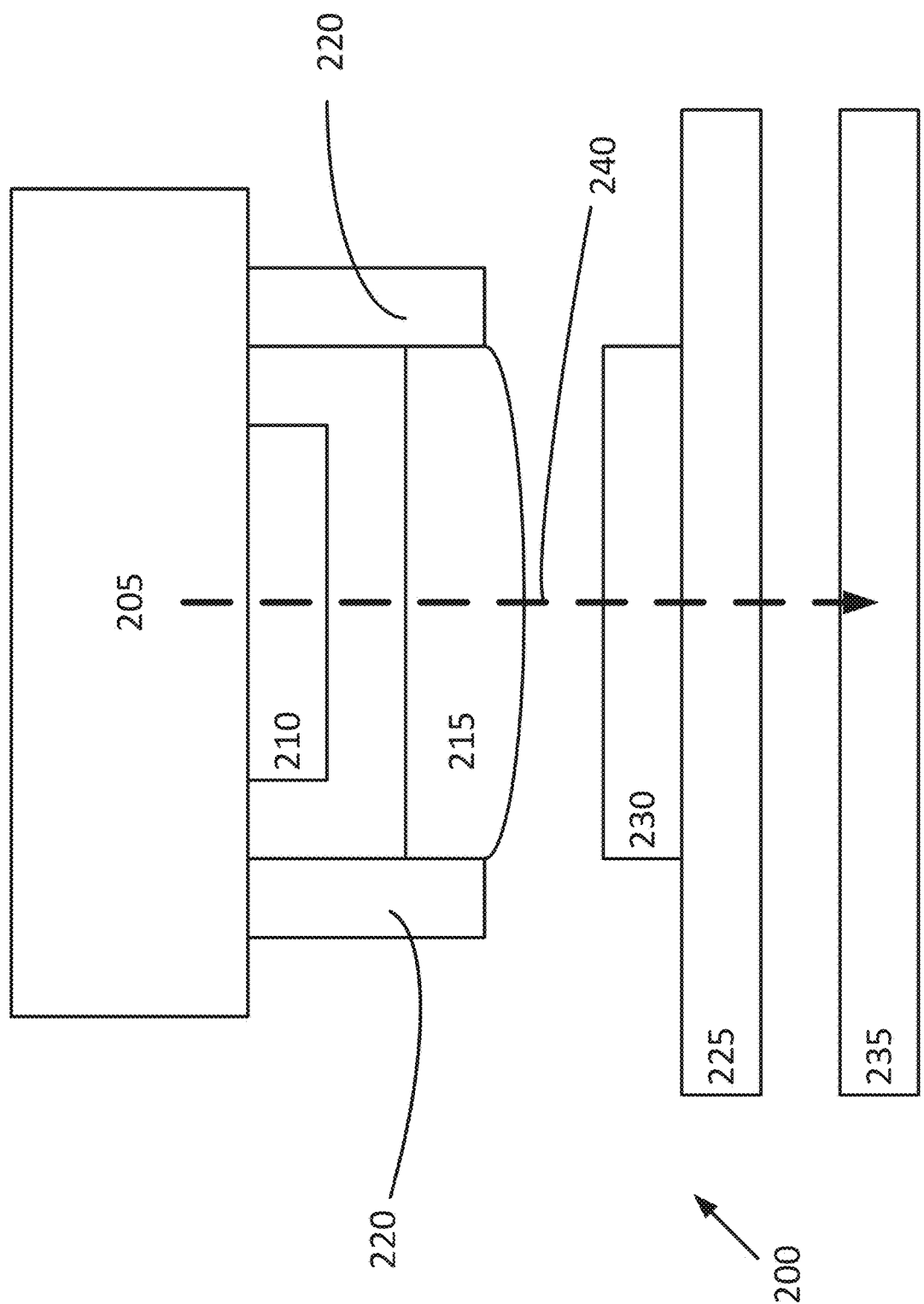
FIG. 4 depicts an alternative example x-ray machine in use with an x-ray filter, in accordance with embodiments herein.
Figure 5:
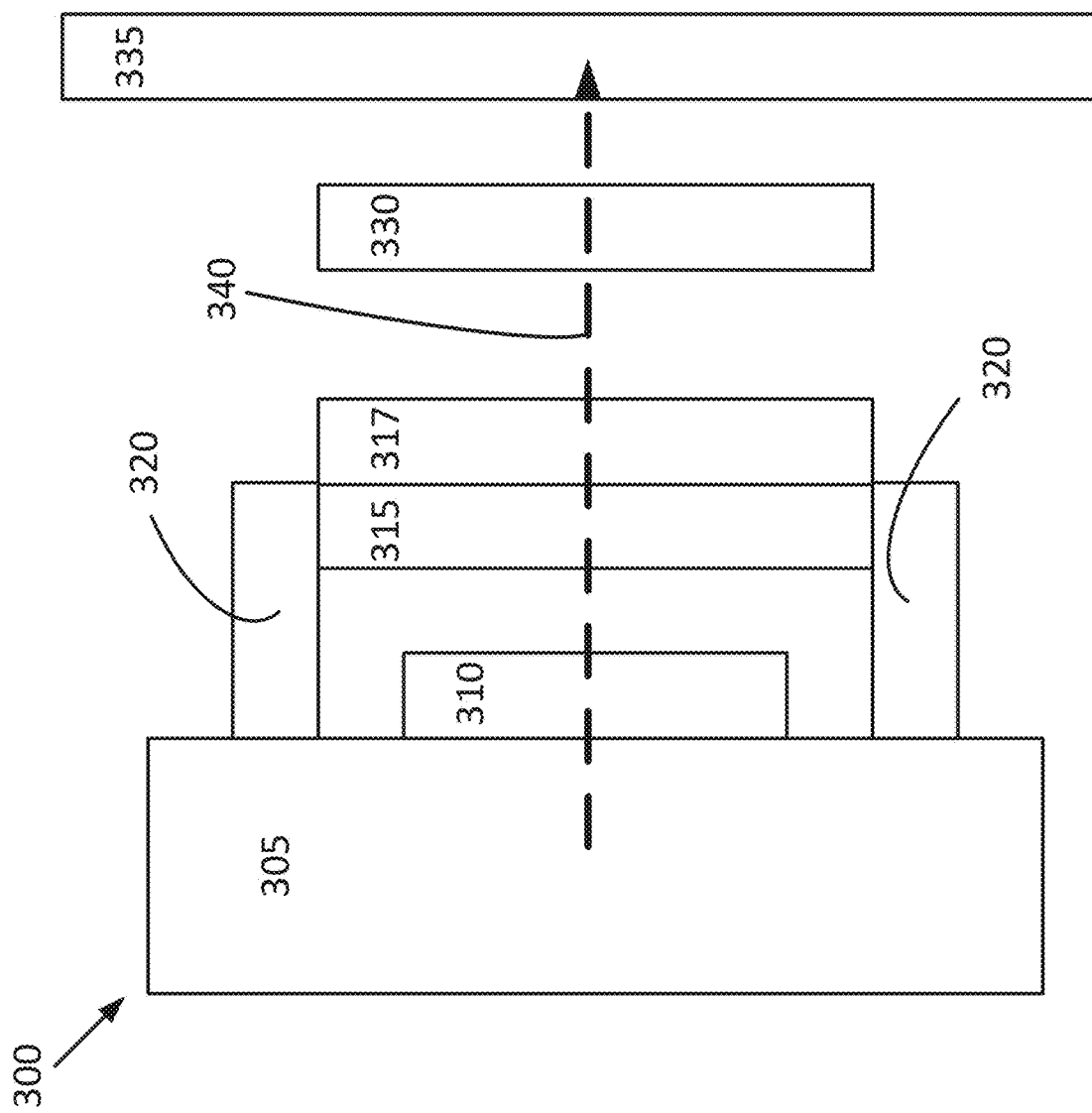
FIG. 5 depicts an alternative example x-ray machine in use with an x-ray filter, in accordance with embodiments herein.

FIGS. 3-5 depict various configurations in which the titanium filter may be implemented. Specifically, FIG. 3 depicts an example x-ray machine 100 that may use with a titanium x-ray filter 115, in accordance with embodiments herein. The x-ray machine 100 may be used, for example, for 2D x-ray images or 3D laminography. As depicted in FIG. 3, the path of x-rays within the x-ray machine 100 may generally be considered to be "upward."

The x-ray machine may include an x-ray source 105 with a window 110. The x-ray source 105 may be a conventional mechanical, electrical, chemical, or other type of source of x-rays as may be known in the art that is capable of producing a beamline 140 of x-rays that travel from the window 110. As shown in FIG. 3, the beamline 140 may be approximately vertical with respect to the orientation of FIG. 3. Although the beamline 140 is depicted in FIG. 3 as a single relatively narrow line, in other embodiments the beamline 140 may be significantly wider, for example encompassing the width (i.e., the lateral measurement with respect to the orientation of FIG. 3) of the window 110, the filter 115, the DUT 130, or the detector 135. The window 110 may be glass, plastic, or some other type of x-ray permeable material.

The x-ray machine 100 may further include a plurality of supports 120. The supports may be metal, plastic, or some other relatively hard material that is capable of holding a titanium filter 115. It will be understood that although supports 120 are depicted in FIG. 3 as approximately vertical and rectangular, the supports 120 in other embodiments may be some other shape such as rounded, trapezoidal, triangular, etc. Also, although only two supports 120 are shown in FIG. 3, other embodiments may include more or fewer supports 120. Additionally, although the supports 120 are shown as separate from the filter 115, in other embodiments the filter 115 and the supports 120 may be a unitary piece, for example a single piece of titanium that is configured to affix to the x-ray source 105 in some manner to hold the filter 115 in the path of the beamline 140.

As can be seen, the filter 115 may be a distance Z2 away from the window. In embodiments, the distance Z2 may be approximately 100 microns, however in other embodiments the distance Z2 may be larger or smaller than approximately 100 microns. For example, in some embodiments the distance Z2 may be between approximately 50 microns and approximately 150 microns. Generally, the distance Z2 may be based on factors such as allowing appropriate heat convection to occur so that one or more elements of the x-ray machine 100 do not overheat, however the distance may also be based on a desire to not place the filter 115 so far away from the window 110 that beamline dispersion occurs.

Similarly, the filter 115 may have a distance Z1 as measured generally parallel to the beamline 140. This distance may in some cases be referred to as a "thickness" or "z-height" of the filter 115. As noted above, in embodiments the distance Z1 may be between approximately 100 microns and approximately 300 microns thick. However, in other embodiments the distance Z1 may be larger or smaller. For example, in some embodiments the distance Z1 may be 1 mm or larger. Generally, the distance Z1 may be based on a number of factors such as material composition and shape of the DUT, the distance between the DUT and the x-ray source, the total direct exposure time in the x-ray beamline, total indirect exposure time while the DUT remains inside the x-ray chamber, etc.

A DUT 130 (e.g., a memory such as a DRAM, SRAM, HBM, etc.) may be positioned on a stage 125. The stage 125 may be, for example, a plastic, or glass material. Generally, the stage 125 may be an x-ray transparent but relatively solid material that may hold the DUT 130 in place within the beamline 140. Although DUT 130 is described herein as a memory, in other embodiments the DUT 130 may be a different type of silicon-based semiconductor chip such as a processing unit.

The beamline 140 may pass from the x-ray source 105, through the window 110, and then through the filter 115 where x-ray energies of less than approximately 15 keV may be either completely or significantly eliminated from the beamline 140. From there, the beamline 140 may pass through the stage 125 and into the DUT 130. The beamline 140 may then exit the DUT 130 and strike a detector 135. The detector 135 may be an x-ray reactive plate, a digital sensor, or some other detector that is configured to measure or store received x-ray energy where it may then be processed to generate an image.

FIG. 4 depicts an alternative example x-ray machine 200 that may use with a titanium x-ray filter 215, in accordance with embodiments herein. The x-ray machine 200 may be used, for example, for 2D x-ray images or 3D laminography. As depicted in FIG. 4, the path of x-rays within the x-ray machine 200 may generally be considered to be "downward."

The x-ray machine 200 may include an x-ray source 205, a window 210, supports 220, a DUT 230, a stage 225, and a detector 235 which may be respectively similar to x-ray source 105, window 110, supports 120, DUT 130, stage 125, and detector 135. Generally, the x-ray machine 200 may be configured to project a beamline 240, which may be similar to beamline 140.

The x-ray machine 200 may further include a filter 215 which may be similar to filter 115. Specifically, the filter 215 may be a titanium filter formed of the titanium or titanium alloys discussed above. Additionally, the filter 215 may have similar z-height measurements as discussed above with respect to filter 115. Additionally, the filter 215 may be separate from, but affixed to, the supports 220, whereas in other embodiments the filter 215 and the supports 220 may be a unitary element.

As can be seen in FIG. 4, the filter 215 may not have an even shape across the width (i.e., the lateral measurement of the filter 215 as depicted in FIG. 4) of the filter 215. For example, as shown in FIG. 4, the filter 215 may be generally rounded and have a greater z-height at a central portion of the filter 215 than the portions of the filter 215 closest to the supports 220. This rounded shape is only one example of a possible non-even filter, and other embodiments may have shapes with different cross-sections that are thicker or narrower in various parts of the filter 215. The different z-heights may allow the filter to increasingly filter x-rays at the thicker (e.g., the portions of the filter 215 with a greater z-height) parts of the filter 215. This increasing filter may be desirable if, for example, certain portions of the DUT 230 are known to be more likely to suffer negative effects from x-rays with energies below approximately 15 keV, and so increased filtering of those energies may be beneficial.

FIG. 5 depicts an alternative example x-ray machine 300 that may use with a titanium x-ray filter 315, in accordance with embodiments herein. The x-ray machine 300 may be used, for example, for 2D x-ray images or 3D computed tomography. As depicted in FIG. 5, the path of x-rays within the x-ray machine 300 may generally be considered to be "lateral."

The x-ray machine 300 may include an x-ray source 305, a window 310, supports 320, a DUT 330, and a detector 335 which may be respectively similar to x-ray source 105, window 110, supports 120, DUT 130, and detector 135. Generally, the x-ray machine 300 may be configured to project a beamline 340, which may be similar to beamline 140.

The x-ray machine 300 may also include a stage 325, which may be similar to stage 125. Specifically, the stage 325 may be within the plane of FIG. 5, and the DUT 330 may be mounted to the stage 325 such that the DUT 330 would project out of the plane of the FIG. 5 towards the reader.

The x-ray machine 300 may additional include a plurality of filters 315 and 317. One of the filters 315 and 317 may be a titanium filter such as the titanium filters discussed above. The other of the filters 315 and 317 may be a filter made of a different material such as zinc (Zn), gold (Au), silver (Ag), lead (Pb), germanium (Ge), boron (B), or indium (In). Alternatively, the other of the filters 315 and 317 may be a titanium filter with a different alloy makeup, or some other type of filter. In embodiments, the filters 315 and 317 may be separate filters that are physically coupled with one another such as by an adhesive, a clamp, or some other type of physical coupling. In other embodiments, the filters 315 and 317 may be separate layers of a unitary whole. For example, filter 315 may be a portion of an overall filter that is doped with different materials or chemicals than the portion of the filter that is depicted as filter 317. In some embodiments the two filters 315 and 317 may have the same general shape as one another, with similar dimensions, for example as depicted in FIG. 5. In other embodiments, one of the filters 315 and 317 may have a different dimension or shape in one or more directions than the other of the filters 315 and 317. The combination of the two filters 315 and 317 may allow a user to better customize which x-ray energies are bypassed and which x-ray energies are partially or fully blocked by the filters 315 and 317.

It will be understood that the depictions of the x-ray machines in FIGS. 3-5 are intended as examples, and other embodiments may include one or more variations. For example, in some embodiments the various x-ray machines may include more or fewer elements. For example, there may be a plurality of windows, stages, detectors, pillars, etc. In other embodiments, various elements such as the stage, one or more of the pillars, etc. may be missing. Additionally, it will be understood that the specific elements, and the specific shapes thereof, are intended as simplified examples. Other embodiments may include elements such as the stage, the detector, the x-ray source, the DUT, etc. which may not be the simplified rectangular shape depicted in FIGS. 3-5. Finally, it will be understood that various aspects of the filters of FIGS. 3-5 may be combined. For example, in some embodiments an x-ray machine may include an unevenly shaped filter such as filter 215 that is composed of a plurality of layers such as filters 315 and 317. Other variations or combinations may be possible and may be selected based on factors such as the time which the DUT may be x-rayed, physical characteristics or weaknesses of the DUT, the specific set-up of various x-ray machines or x-ray sources, or other factors.

Figure 6:
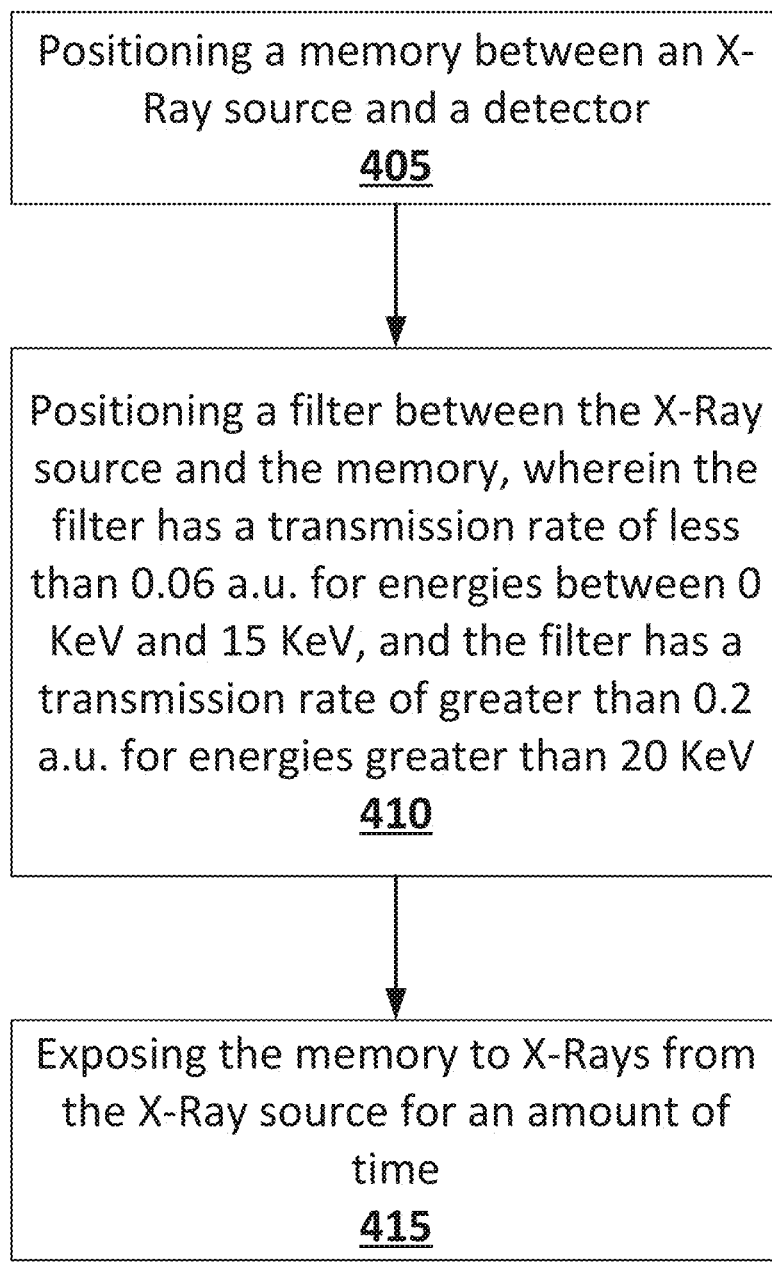
FIG. 6 depicts an example technique for the use of the x-ray machine of FIG. 3, 4, or 5, or some other x-ray machine, in accordance with embodiments herein.

FIG. 6 depicts an example technique for the use of the x-ray machines 100/200/300 of FIG. 3, 4, or 5, or some other x-ray machine, in accordance with embodiments herein. Specifically, FIG. 6 will be described with respect to the x-ray machine 100 of FIG. 3, however it will be understood that the technique discussed herein may additionally be applied, in whole or in part, with or without modifications, to the x-ray machines of FIGS. 4, 5, or some other x-ray machine that uses a titanium filter.

The technique may include positioning, at 405, a DUT between an x-ray source and a detector. The DUT may be, for example, DUT 130. The x-ray source may be, for example x-ray source 105 and the detector may be, for example, detector 135.

The technique may further include positioning, at 410, a filter between the x-ray source and the DUT. The filter may be, for example, filter 115 which may be a titanium filter. Specifically, the filter may have a transmission rate of less than 0.06 a.u. for x-ray energies between approximately 0 keV and approximately 15 keV, and the filter may have a transmission rate of greater than approximately 0.2 a.u. for x-ray energies greater than approximately 20 keV.

The technique may further include exposing, at 415, the DUT to x-rays from the x-ray source for an amount of time. As discussed above with respect to FIG. 2, in embodiments the amount of time may vary dependent on the specific needs or parameters related to the analysis of the DUT.

It will be understood that the technique of FIG. 6 is intended as an example, and other embodiments may have more or fewer elements, or the elements in a different order, than those shown in FIG. 6.

EXAMPLES OF VARIOUS EMBODIMENTS

Example 1 includes an x-ray filter comprising: a first side that is to be positioned adjacent to an x-ray source output; and a second side that is to be positioned adjacent to a device under test (DUT) that is to be x-rayed; wherein the x-ray filter includes at least 80% titanium (Ti).

Example 2 includes the x-ray filter of example 1, wherein a distance between the first side and the second side is between 100 micrometers ("microns") and 1000 microns.

Example 3 includes the x-ray filter of example 2, wherein the distance between the first side and the second side is between 100 microns and 300 microns.

Example 4 includes the x-ray filter of example 1, wherein a distance between the first side and the second side is greater than 1 millimeter.

Example 5 includes the x-ray filter of example 1, wherein the DUT is a Dynamic Random Access Memory (DRAM).

Example 6 includes the x-ray filter of example 1, wherein the DUT is a Static Random Access Memory (SRAM).

Example 7 includes the x-ray filter of example 1, wherein the DUT is High-Bandwidth Memory (HBM).

Example 8 includes the x-ray filter of example 1, wherein a distance between the first side and the second side is a first value at a first portion of the x-ray filter, and wherein the distance between the first side and the second side is a second value at a second portion of the x-ray filter.

Example 9 includes the x-ray filter of example 1, wherein with absorption compensation of the Ti is inversely proportional to a distance between the first side and the second side of the x-ray filter.

Example 10 includes the x-ray filter of any of examples 1-9, wherein the x-ray filter includes at least 80% Ti by weight.

Example 11 includes the x-ray filter of example 10, wherein the at least 80% Ti is in a first layer of the x-ray filter, and wherein the x-ray filter further includes a second layer physically coupled with the first layer, and wherein the second layer includes zinc (Zn), gold (Au), silver (Ag), lead (Pb), germanium (Ge), boron (B), or indium (In).

Example 12 includes the x-ray filter of any of examples 1-9, wherein the x-ray filter includes Ti with purity by weight lower than 90%.

Example 13 includes the x-ray filter of any of examples 1-9, wherein the x-ray filter has a transmission rate of less than 6% for energies between 0 kiloelectronvolts (KeV) and 15 KeV.

Example 14 includes the x-ray filter of example 13 wherein the x-ray filter has a transmission rate of greater than 0.2 a.u. for energies greater than 20 KeV.

Example 15 includes the x-ray filter of example 14, wherein the x-ray filter has a transmission rate of greater than 0.8 a.u. for energies greater than 40 KeV.

Example 16 includes an x-ray machine comprising: an x-ray source; an x-ray filter positioned adjacent to the x-ray source, wherein the x-ray filter includes at least 90% titanium (Ti); and a mount for an electronic memory that is to be x-rayed, wherein the x-ray filter is between the x-ray source and the mount.

Example 17 includes the x-ray machine of example 16, wherein the electronic memory is a Dynamic Random Access Memory (DRAM).

Example 18 includes the x-ray machine of example 16, wherein the x-ray filter is at least 90% Ti by weight.

Example 19 includes the x-ray machine of any of examples 16-18, wherein the filter is a first filter and further comprising a second filter positioned adjacent to the first filter, and wherein the second filter includes zinc (Zn), gold (Au), silver (Ag), lead (Pb), germanium (Ge), boron (B), or indium (In).

Example 20 includes the x-ray machine of example 19, wherein the second filter is physically coupled with the first filter.

Example 21 includes the x-ray machine of example 19, wherein the first filter and the second filter have an identical cross-sectional area as measured with respect to a direction of travel of an x-ray from the x-ray source.

Example 22 includes the x-ray machine of example 19, wherein the first filter and the second filter have a different cross-sectional area from one another as measured with respect to a direction of travel of an x-ray from an x-ray source.

Example 23 includes a method of testing a memory for an electronic device, the method comprising: positioning a memory between an x-ray source and a detector; positioning a filter between the x-ray source and the memory, wherein the filter has a transmission rate of less than 0.06 arbitrary units (a.u.) for energies between 0 kiloelectronvolts (KeV) and 15 KeV, and the filter has a transmission rate of greater than 0.2 a.u. for energies greater than 20 KeV; and exposing the memory to x-rays from the x-ray source for an amount of time.

Example 24 includes the method of example 23, further comprising positioning the filter 100 micrometers ("microns") away from the x-ray source.

Example 25 includes the method of example 23, wherein the filter includes at least 90% titanium (Ti) by weight.

Example 26 includes the method of example 23, wherein the memory is a Dynamic Random Access Memory (DRAM).

Example 27 includes the method of any of examples 23-26, wherein the amount of time is an hour.

Example 28 includes the method of any of examples 23-26, wherein positioning the memory between the x-ray source and the detector includes positioning the memory on a stage that is between the x-ray source and the detector.

Example 29 includes the method of example 28, wherein the stage is a rotating stage.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. An x-ray filter comprising:
a first side; and
a second side;
wherein the x-ray filter includes at least 80% titanium (Ti), the x-ray filter has a transmission rate from the first side to the second side of less than 0.06 arbitrary units (a.u.) for energies below 15 kiloelectronvolts (KeV), and the x-ray filter has a transmission rate from the first side to the second side of at least 0.2 a.u. for energies greater than 20 KeV.

2. The x-ray filter of claim 1, wherein a distance between the first side and the second side is between 100 micrometers ("microns") and 1000 microns.

3. The x-ray filter of claim 1, wherein a distance between the first side and the second side is greater than 1 millimeter.

4. The x-ray filter of claim 1, wherein the x-ray filter is coupled to a mount for an electronic memory, and the electronic memory is a Dynamic Random Access Memory (DRAM), a Static Random Access Memory (SRAM), or a High-Bandwidth Memory (HBM).

5. The x-ray filter of claim 1, wherein a distance between the first side and the second side is a first value at a first portion of the x-ray filter, and wherein the distance between the first side and the second side is a second value at a second portion of the x-ray filter.

6. The x-ray filter of claim 1, wherein with absorption compensation of the Ti is inversely proportional to a distance between the first side and the second side of the x-ray filter.

7. The x-ray filter of claim 1, wherein the x-ray filter includes at least 80% Ti by weight.

8. The x-ray filter of claim 7, wherein the at least 80% Ti is in a first layer of the x-ray filter, and wherein the x-ray filter further includes a second layer physically coupled with the first layer, and wherein the second layer includes zinc (Zn), gold (Au), silver (Ag), lead (Pb), germanium (Ge), boron (B), or indium (In).

9. An x-ray machine comprising:
an x-ray source;
an x-ray filter positioned adjacent to the x-ray source, wherein the x-ray filter includes at least 90% titanium (Ti); and
a mount for an electronic memory that is to be x-rayed, wherein the x-ray filter is between the x-ray source and the mount, and the x-ray filter has a transmission rate from the x-ray source towards the mount of less than 0.06 arbitrary units (a.u.) for energies below 15 kiloelectronvolts (KeV), and the x-ray filter has a transmission rate from the x-ray source towards the mount of at least 0.2 a.u. for energies greater than 20 KeV.

10. The x-ray machine of claim 9, wherein the electronic memory is a Dynamic Random Access Memory (DRAM).

11. The x-ray machine of claim 9, wherein the x-ray filter is at least 90% Ti by weight.

12. The x-ray machine of claim 9, wherein the filter is a first filter and further comprising a second filter positioned adjacent to the first filter, and wherein the second filter includes zinc (Zn), gold (Au), silver (Ag), lead (Pb), germanium (Ge), boron (B), or indium (In).

13. The x-ray machine of claim 12, wherein the second filter is physically coupled with the first filter.

14. A method of testing a memory for an electronic device, the method comprising:
positioning a memory between an x-ray source and a detector;
positioning a filter between the x-ray source and the memory, wherein the filter has a transmission rate of less than 0.06 arbitrary units (a.u.) for energies between 0 kiloelectronvolts (KeV) and 15 KeV, and the filter has a transmission rate of greater than 0.2 a.u. for energies greater than 20 KeV; and
exposing the memory to x-rays from the x-ray source for an amount of time.

15. The method of claim 14, further comprising positioning the filter 100 micrometers ("microns") away from the x-ray source.

16. The method of claim 14, wherein the filter includes at least 90% titanium (Ti) by weight.

17. The method of claim 14, wherein the memory is a Dynamic Random Access Memory (DRAM).

18. The method of claim 14, wherein the amount of time is an hour.

19. The method of claim 14, wherein positioning the memory between the x-ray source and the detector includes positioning the memory on a stage that is between the x-ray source and the detector.

20. The x-ray filter of claim 1, wherein the x-ray filter includes at least 90% Ti by weight.

* * * * *